US010608585B2

(12) United States Patent
Zhang

(10) Patent No.: US 10,608,585 B2
(45) Date of Patent: Mar. 31, 2020

(54) AMPLITUDE LIMITING OSCILLATION CIRCUIT

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 188 days.

(21) Appl. No.: 15/871,427

(22) Filed: Jan. 15, 2018

(65) Prior Publication Data
US 2018/0138860 A1 May 17, 2018

Related U.S. Application Data

(63) Continuation of application No. PCT/CN2016/103225, filed on Oct. 25, 2016.

(51) Int. Cl.
H03B 5/12 (2006.01)
H03K 7/08 (2006.01)
H03B 5/36 (2006.01)
H03L 5/00 (2006.01)
(Continued)

(52) U.S. Cl.
CPC ......... H03B 5/1234 (2013.01); H03B 5/1215 (2013.01); H03B 5/1228 (2013.01);
(Continued)

(58) Field of Classification Search
CPC ....... H03L 5/00; H03L 2207/50; H03L 7/085; H03L 7/0991; H03L 7/1806; H03L 1/00;
(Continued)

(56) References Cited

U.S. PATENT DOCUMENTS 6,680,655 B2 * 1/2004 Rogers ................. H03B 5/1231
331/109
7,170,359 B2 1/2007 Koerner
(Continued)

FOREIGN PATENT DOCUMENTS

CN 101399908 A 4/2009
CN 101771401 A 7/2010
(Continued)

OTHER PUBLICATIONS

International Search Report for International Application No. PCT/CN2016/103225, Applicant: Shenzhen Goodix Technology Co., Ltd., dated Oct. 25, 2016, 5 pages.

Primary Examiner — Arnold M Kinkead

(57) ABSTRACT

An amplitude limiting oscillation circuit is disclosed. The amplitude limiting oscillation circuit includes: an oscillation circuit, configured to generate an oscillation signal; a pulse width modulation circuit, configured to generate a pulse width modulation signal according to an amplitude of the oscillation signal; a low pass filtering circuit, configured to convert the pulse width modulation signal into a direct current control voltage signal, where the direct current control voltage signal is configured to control a voltage controlled resistance circuit; and the voltage controlled resistance circuit, configured to change a resistance value of the voltage controlled resistance circuit according to under the direct current control voltage signal, to control the amplitude of the oscillation signal. The amplitude limiting oscillation circuit, may improve performance of the amplitude limiting oscillation circuit.

13 Claims, 4 Drawing Sheets

(51) Int. Cl.
  *H03B 5/32* (2006.01)
  *H03K 4/48* (2006.01)
  *H03G 3/00* (2006.01)
(52) U.S. Cl.
  CPC ............... *H03B 5/364* (2013.01); *H03K 7/08* (2013.01); *H03L 5/00* (2013.01); *H03B 5/32* (2013.01); *H03B 2200/009* (2013.01); *H03G 3/001* (2013.01); *H03K 4/48* (2013.01)
(58) Field of Classification Search
  CPC ......... H03L 1/02; H03L 1/026; H03B 5/1228; H03B 5/1265; H03B 23/00; H03B 28/00; H03B 5/04; H03B 5/1212; H03B 5/1215; H03B 5/1243; H03B 5/1253; H03B 5/1287; H03B 5/1293; H03B 5/1296; H03B 5/362; H03B 5/1234; H03B 2200/009; H03B 5/32; H03K 7/08; H03K 4/48
  USPC .......................................... 331/175, 183, 182
  See application file for complete search history.

(56) References Cited

U.S. PATENT DOCUMENTS

| | | | |
|---|---|---|---|
| 8,093,958 B2 * | 1/2012 | O'Day | H03L 1/02 331/117 R |
| 8,471,644 B2 * | 6/2013 | Thelen | H04L 27/08 331/109 |
| 8,836,442 B2 | 9/2014 | Greenberg et al. | |
| 2008/0297218 A1 | 12/2008 | Greenberg et al. | |
| 2009/0134947 A1 | 5/2009 | Tarng | |
| 2011/0109359 A1 | 5/2011 | Greenberg | |
| 2014/0320216 A1 | 10/2014 | Wang | |
| 2015/0061786 A1 | 3/2015 | Mai | |

FOREIGN PATENT DOCUMENTS

| | | |
|---|---|---|
| CN | 102332912 A | 1/2012 |
| CN | 103248320 A | 8/2013 |
| CN | 203233361 U | 10/2013 |
| CN | 103645764 A | 3/2014 |

\* cited by examiner

AMPLITUDE LIMITING OSCILLATION CIRCUIT

CROSS REFERENCE TO RELATED APPLICATIONS

The present application is a continuation of international application No. PCT/CN2016/103225, filed on Oct. 25, 2016, which is hereby incorporated by reference in its entirety.

TECHNICAL FIELD

The present disclosure relates to the field of information technologies, and in particular, to an amplitude limiting oscillation circuit.

BACKGROUND

If no amplitude limitation is performed on a common LC oscillation circuit, an amplitude of the oscillation circuit would eventually stabilize to a power supply voltage, and such oscillation circuit has several disadvantages as follows: 1. distortion of an oscillation waveform of the oscillation circuit occurs, and a rising edge and a falling edge thereof are dissymmetrical, such that a $1/f^3$ noise inflection point of the oscillation circuit moves to a high frequency, resulting in worse low frequency phase noise; and 2. a large oscillation amplitude causes a very large current through an inductor, such that a magnetic core of the inductor is saturated, resulting in a change of an inductance value, ultimately affecting stability of a frequency.

Usually, an approach of limiting amplitude is to detect an oscillation amplitude by using an amplitude detection circuit or a peak detection circuit, and then output a control voltage to control a bias current of an oscillation circuit, so as to achieve an effect of limiting the amplitude of the oscillation circuit. However, the approach also has several disadvantages as follows: 1. a loop gain of such approach is larger, easily resulting in instability of a control loop; 2. the control loop per se may introduce greater noise, resulting in worse phase noise of the oscillation circuit; and 3. most of the amplitude detection circuits cannot accurately control the oscillation amplitude, thereby limiting its utility.

Therefore, it becomes a technical problem to be solved urgently to improve performance of an amplitude limiting oscillation circuit.

SUMMARY

Embodiments of the present disclosure provide an amplitude limiting oscillation circuit, and performance of the amplitude limiting oscillation circuit may be improved.

According to a first aspect, an amplitude limiting oscillation circuit is provided, including:

an oscillation circuit 110, configured to generate an oscillation signal;

a pulse width modulation circuit 120, configured to generate a pulse width modulation signal according to an amplitude of the oscillation signal;

a low pass filtering circuit 130, configured to convert the pulse width modulation signal into a direct current control voltage signal, where the direct current control voltage signal is configured to control a voltage controlled resistance circuit 140; and the voltage controlled resistance circuit 140, configured to change a resistance value of the voltage controlled resistance circuit 140 under control of the direct current control voltage signal, to control the amplitude of the oscillation signal.

According to the amplitude limiting oscillation circuit of the embodiments of the present disclosure, negative feedback is performed by using a voltage controlled resistance circuit, and a control loop may not introduce extra noise; therefore, phase noise of the amplitude limiting oscillation circuit is lower, and performance of the amplitude limiting oscillation circuit is improved.

In some possible implementation manners, the oscillation circuit 110 is an LC oscillation circuit, a crystal oscillation circuit or a relaxation oscillation circuit.

In some possible implementation manners, the pulse width modulation circuit 120 includes a comparator, configured to generate the pulse width modulation signal by comparing an amplitude of a reference signal with the amplitude of the oscillation signal.

When the comparator is used, the amplitude of the amplitude limiting oscillation circuit depends on a reference voltage of the comparator, that is, a final amplitude range of the amplitude limiting oscillation circuit is very close to the reference voltage of the comparator; therefore, it is easy to control the oscillation amplitude of the amplitude limiting oscillation circuit of the embodiments of the present disclosure.

In some possible implementation manners, the low pass filtering circuit 130 is a passive filter or an active filter.

In some possible implementation manners, resistance of the voltage controlled resistance circuit 140 is linear resistance or nonlinear resistance that operates in a linear region.

In some possible implementation manners, the voltage controlled resistance circuit 140 includes a metal oxide semiconductor field effect transistor MOS.

In some possible implementation manners, the oscillation circuit 110 includes a positive output end and a negative output end.

In some possible implementation manners, the oscillation circuit 110 includes:

an inductor 111, and a first capacitor 112, where the inductor 111 and the first capacitor 112 form a resonant circuit; and a first MOS transistor 113, a second MOS transistor 114, a third MOS transistor 115, and a fourth MOS transistor 116, where the first MOS transistor 113, the second MOS transistor 114, the third MOS transistor 115, and the fourth MOS transistor 116 provide negative resistance for the resonant circuit, a drain electrode of the first MOS transistor 113 and a gate electrode of the second MOS transistor 114 form a positive output end of the oscillation circuit 110, and a gate electrode of the third MOS transistor 115 and a drain electrode of the fourth MOS transistor 116 form a negative output end of the oscillation circuit 110.

In some possible implementation manners, the pulse width modulation circuit 120 includes:

a first comparator 121, where a positive input end of the first comparator 121 is connected to the positive output end of the oscillation circuit 110, and a negative input end of the first comparator 121 is configured to input a first reference signal; and a second comparator 122, where a positive input end of the second comparator 122 is connected to the negative output end of the oscillation circuit 110, and a negative input end of the second comparator 122 is configured to input a second reference signal.

In some possible implementation manners, the amplitude limiting oscillation circuit further includes:

a switching circuit 150, configured to switch a connection between the positive input end or the negative output end and the pulse width modulation circuit 120.

In some possible implementation manners, the switching circuit 150 includes:

a third comparator 151, an inverter 152, a first switch 153, a second switch 154, a third switch 155 and a fourth switch 156;

where a positive input end of the third comparator 151 is connected to the positive output end of the oscillation circuit 110, a negative input end of the third comparator 151 is connected to the negative output end of the oscillation circuit 110, an input end of the inverter 152 is connected to an output end of the third comparator 151, an output signal of the third comparator 151 is used to control the first switch 153 and the fourth switch 156, and an output signal of the inverter 152 is used to control the second switch 154 and the third switch 155.

In some possible implementation manners, the pulse width modulation circuit 120 includes:

a first comparator 121, where a positive input end of the first comparator 121 is connected to the positive output end of the oscillation circuit 110 through the first switch 153, and connected to the negative output end of the oscillation circuit 110 through the second switch 154, and a negative input end of the first comparator 121 is configured to input a first reference signal; and a second comparator 122, where a positive input end of the second comparator 122 is connected to the positive output end of the oscillation circuit 110 through the third switch 155, and connected to the negative output end of the oscillation circuit 110 through the fourth switch 156, and a negative input end of the second comparator 122 is configured to input a second reference signal.

According to the amplitude limiting oscillation circuit of the embodiments of the present disclosure, a switching circuit is used, and an adjustable range may be expanded.

In some possible implementation manners, the low pass filtering circuit 130 includes:

a first low pass filter, including a first resistor 131 and a second capacitor 132, where an input end of the first low pass filter is connected to an output end of the first comparator 121, and an output end of the first low pass filter is connected to a gate electrode of a fifth MOS transistor 141; and a second low pass filter, including a second resistor 133 and a third capacitor 134, where an input end of the second low pass filter is connected to an output end of the second comparator 122, and an output end of the second low pass filter is connected to a gate electrode of a sixth MOS transistor 142; and the voltage controlled resistance circuit 140 includes:

the fifth MOS transistor 141, where a source electrode of the fifth MOS transistor 141 is connected to a power supply, and a drain electrode of the fifth MOS transistor 141 is connected to a source electrode of the first MOS transistor 113 and a source electrode of the second MOS transistor 114; and the sixth MOS transistor 142, where a source electrode of the sixth MOS transistor 142 is connected to ground, and a drain electrode of the sixth MOS transistor 142 is connected to a source electrode of the third MOS transistor 115 and a source electrode of the fourth MOS transistor 116.

Amplitude control of the amplitude limiting oscillation circuit of the embodiments of the present disclosure is mainly based on source electrode feedback; therefore, the manner of the amplitude control does not have a problem of stability, that is, the stability of the amplitude limiting oscillation circuit of the embodiments of the present disclosure is better.

According to a second aspect, a chip is provided, and the chip includes the amplitude limiting oscillation circuit of the first aspect or the amplitude limiting oscillation circuit of any one of possible implementation manners of the first aspect.

BRIEF DESCRIPTION OF DRAWINGS

To illustrate a technical solution of embodiments of the present disclosure more clearly, the accompanying drawings which are needed in the embodiments of the present disclosure are introduced briefly below. Apparently, the accompanying drawings described below are merely some of the embodiments of the present disclosure, based on which other drawings can be obtained by persons of ordinary skill in the art without any creative effort.

DESCRIPTION OF EMBODIMENTS

The technical solution in the embodiments of the present disclosure will be described clearly and fully below in conjunction with the drawings in the embodiments of the present disclosure, and apparently, the embodiments described are only part of embodiments of the present disclosure, not all of them. All of the other embodiments, obtained by those of ordinary skill in the art based on the embodiments of the present disclosure without any creative effort, fall into the protection scope of the present disclosure.

Figure 1:
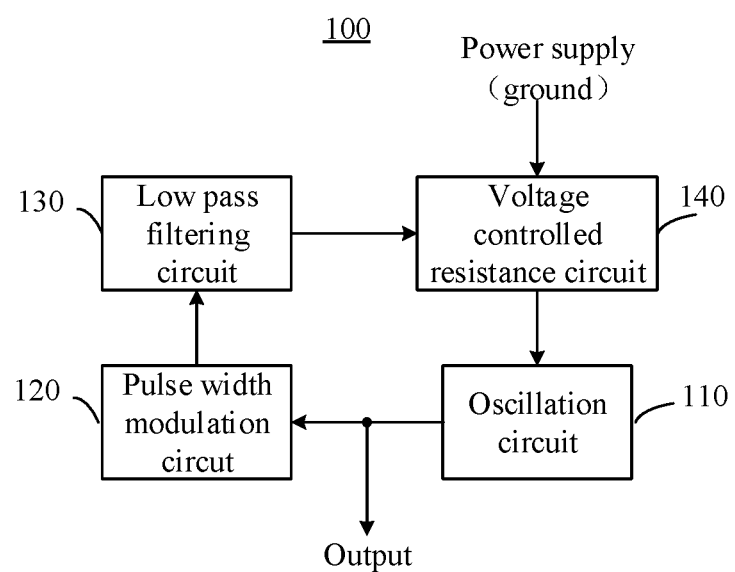
FIG. 1 is a schematic diagram of an amplitude limiting oscillation circuit according to an embodiment of the present disclosure.

FIG. 1 illustrates a schematic diagram of an amplitude limiting oscillation circuit 100 according to an embodiment of the present disclosure.

As shown in FIG. 1, the amplitude limiting oscillation circuit 110 may include an oscillation circuit 110, a pulse width modulation circuit 120, a low pass filtering circuit 130, and a voltage controlled resistance circuit 140.

The oscillation circuit 110 is configured to generate an oscillation signal.

The oscillation circuit 110 may be any type of oscillation circuit, such as LC oscillation circuit, crystal oscillation circuit or relaxation oscillation circuit, and the present disclosure does not limit the type of the oscillation circuit 110.

Optionally, the oscillation circuit 110 may output two oscillation signals. Phases of the two oscillation signals are opposite. That is, the oscillation circuit 110 may have a positive output end and a negative output end, and the positive output end and the negative output end output oscillation signals with opposite phases, respectively.

The pulse width modulation circuit 120 is configured to generate a pulse width modulation signal according to an amplitude of an oscillation signal.

Optionally, the pulse width modulation circuit 120 may include a comparator, and the comparator generates the pulse width modulation signal by comparing an amplitude of a reference signal with the amplitude of the oscillation signal. For example, if the amplitude of the oscillation signal is larger than the amplitude of the reference signal, a high level signal is generated; and if the amplitude of the oscillation signal is lower than the amplitude of the reference signal, a low level signal is generated.

It should be understood that, the pulse width modulation circuit 120 may also be implemented by another circuit, and the present disclosure does not limit that the pulse width modulation circuit 120 is implemented only by a comparator.

The low pass filtering circuit 130 is configured to convert the pulse width modulation signal into a direct current control voltage signal, where the direct current control voltage signal is configured to control the voltage controlled resistance circuit 140.

The pulse width modulation signal generated by the pulse width modulation circuit 120 is input into the low pass filtering circuit 130, and is converted into the direct current control voltage signal by the low pass filtering circuit 130; and the direct current control voltage signal is input into a voltage controlled end of the voltage controlled resistance circuit 140, so as to control a change of a resistance value of the voltage controlled resistance circuit 140.

Optionally, the low pass filtering circuit 130 may be a passive filter or an active filter, and the present disclosure is not limited hereto.

The voltage controlled resistance circuit 140 is configured to change the resistance value of the voltage controlled resistance circuit 140 under control of the direct current control voltage signal, to control the amplitude of the oscillation signal.

The resistance value of the voltage controlled resistance circuit 140 is changed under the control of the direct current control voltage signal. Optionally, resistance of the voltage controlled resistance circuit 140 may be linear resistance or nonlinear resistance that operates in a linear region.

Optionally, the voltage controlled resistance circuit 140 may include metal oxide semiconductor field effect transistor (Metal-Oxide-Semiconductor, MOS). That is, a voltage controlled resistor may be an MOS transistor, but the present disclosure is not limited hereto, and another voltage controlled resistor may also be used.

Figure 2:
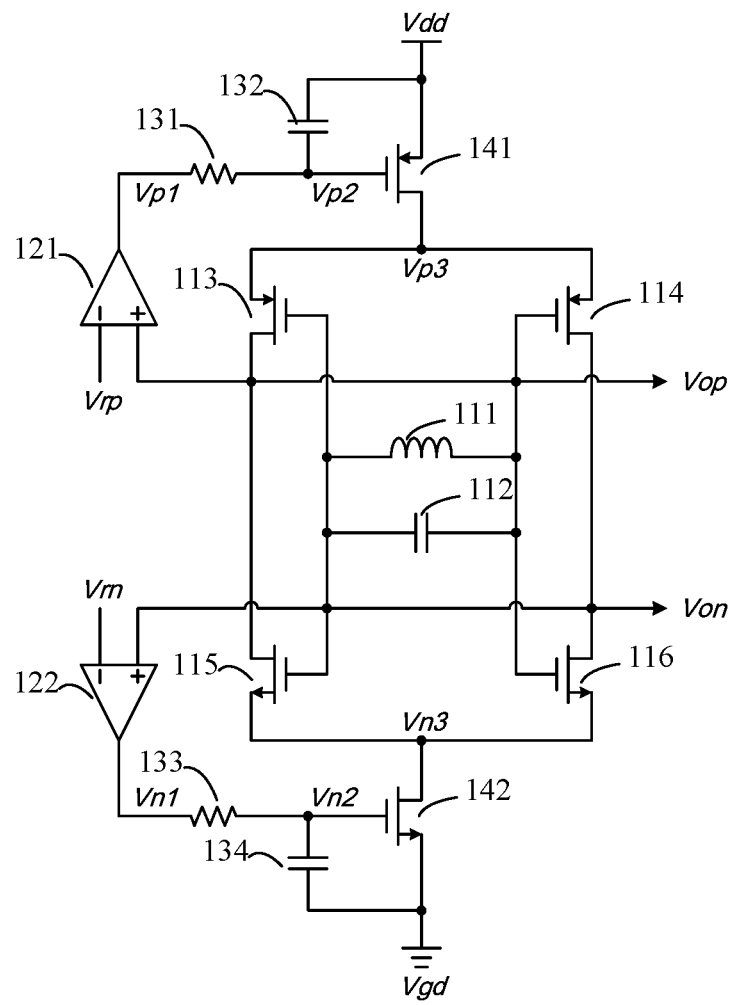
FIG. 2 is a schematic diagram of an amplitude limiting oscillation circuit according to another embodiment of the present disclosure.

FIG. 2 illustrates a schematic diagram of a specific implementation manner of an amplitude limiting oscillation circuit 100 according to an embodiment of the present disclosure.

It should be understood that, FIG. 2 is only an example, which does not limit the scope of the embodiment of the present disclosure.

As shown in FIG. 2, the oscillation circuit 110 in FIG. 1 may be implemented by an inductor, a capacitor and an MOS transistor. Particularly, the oscillation circuit 110 may include an inductor 111, a first capacitor 112, a first MOS transistor 113, a second MOS transistor 114, a third MOS transistor 115, and a fourth MOS transistor 116.

The inductor 111 and the first capacitor 112 form a resonant circuit.

The first MOS transistor 113, the second MOS transistor 114, the third MOS transistor 115 and the fourth MOS transistor 116 provide negative resistance for the resonant circuit.

A drain electrode of the first MOS transistor 113 and a gate electrode of the second MOS transistor 114 form a positive output end of the oscillation circuit 110, and the positive output end outputs an oscillation signal Vop; and a gate electrode of the third MOS transistor 115 and a drain electrode of the fourth MOS transistor 116 form a negative output end of the oscillation circuit 110, and the negative output end outputs an oscillation signal Von.

Optionally, when the oscillation circuit 110 includes the positive output end and the negative output end, a pulse width modulation circuit 120 may be implemented by two comparators.

Particularly, the pulse width modulation circuit 120 may include a first comparator 121 and a second comparator 122.

A positive input end of the first comparator 121 is connected to the positive output end of the oscillation circuit 110, that is, the oscillation signal Vop may be input into the positive input end of the first comparator 121; and a negative input end of the first comparator 121 is configured to input a first reference signal Vrp.

A positive input end of the second comparator 122 is connected to the negative output end of the oscillation circuit 110, that is, the oscillation signal Von may be input into positive input end of the second comparator 122; and a negative input end of the second comparator 122 is configured to input a second reference signal Vrn.

Optionally, Vrp and Vrn may be adjustable direct current voltage signals.

Optionally, Vdd>Vrp>Vrn>Vgd, where Vdd is a voltage of a power supply, and Vgd is a voltage of a ground end.

The first comparator 121 compares Vop with Vrp, and outputs a positive pulse width modulation signal Vp1; and The second comparator 122 compares Von with Vrn, and outputs a negative pulse width modulation signal Vp2.

Optionally, when the pulse width modulation circuit 120 includes two comparators, the low pass filtering circuit 130 may be implemented by two low pass filters.

Particularly, the low pass filtering circuit 130 may include a first low pass filter and a second low pass filter.

As shown in FIG. 2, the first low pass filter may include a first resistor 131 and a second capacitor 132, where an input end of the first low pass filter is connected to an output end of the first comparator 121, and an output end of the first low pass filter is connected to a gate electrode of a fifth MOS transistor 141.

An input of the first low pass filter is Vp1, and the first low pass filter outputs a direct current control voltage signal Vp2 to the gate electrode of the fifth MOS transistor 141.

The second low pass filter may include a second resistor 133 and a third capacitor 134, where an input end of the second low pass filter is connected to an output end of the second comparator 122, and an output end of the second low pass filter is connected to a gate electrode of a sixth MOS transistor 142.

An input of the second low pass filter is Vn1, and the second low pass filter outputs a direct current control voltage signal Vn2 to the gate electrode of the sixth MOS transistor 142.

Correspondingly, the voltage controlled resistance circuit 140 also includes two parts. As shown in FIG. 2, the voltage controlled resistance circuit 140 may include:

the fifth MOS transistor 141, where a source electrode of the fifth MOS transistor 141 is connected to the power supply Vdd, and a drain electrode of the fifth MOS transistor 141 is connected to a source electrode of the first MOS transistor 113 and a source electrode of the second MOS transistor 114; and the sixth MOS transistor 142, where a source electrode of the sixth MOS transistor 142 is connected to ground Vgd, and a drain electrode of the sixth MOS transistor 142 is connected to a source electrode of the third MOS transistor 115 and a source electrode of the fourth MOS transistor 116.

The gate electrode of the fifth MOS transistor 141 and the gate electrode of the sixth MOS 142 are voltage controlled ends of the voltage controlled resistance circuit 140.

An upper loop in FIG. 2 may be called as a P-type feedback loop; and a lower loop in FIG. 2 may be called as an N-type feedback loop. The P-type feedback loop and the N-type feedback loop are completely symmetrical, and working principles of the two are similar.

Taking the P-type feedback loop as an example, when the oscillation circuit starts oscillating, an amplitude of Vop gets larger gradually, and when the amplitude is larger than Vrp, the comparator 121 outputs a high pulse; since Vop is a sine wave signal, the larger the amplitude of Vop is, the wider the width of the high pulse output by the comparator 121 is. A direct current voltage Vp2, that is proportional to the width of the pulse, is obtained after the pulse is passed through a low pass filter. If Vp2 is higher, equivalent resistance of the fifth MOS transistor 141 is greater. That is, if the amplitude of the oscillation circuit becomes larger, the width of the pulse becomes wider, Vp2 increases, the resistance of the fifth MOS transistor 141 increases, negative resistance of the first MOS transistor 113 and the second MOS transistor 114 reduces due to an effect of source electrode negative feedback, and thus the output amplitude begins to decrease. Similarly, an operating principle of the N-type feedback loop may be known.

Figure 3:
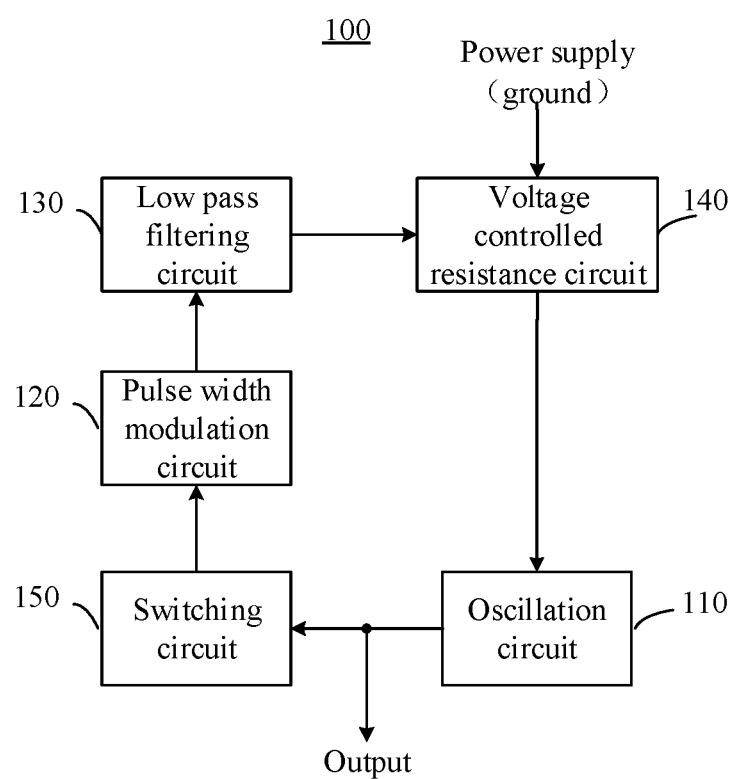
FIG. 3 is a schematic diagram of an amplitude limiting oscillation circuit according to a further embodiment of the present disclosure.

Optionally, as shown in FIG. 3, an amplitude limiting oscillation circuit 100 may further include:

a switching circuit 150, configured to switch a connection between a positive input end or a negative output end and a pulse width modulation circuit 120.

When an oscillation circuit 110 includes the positive output end and the negative output end, a connection between the positive output end or the negative output end and different input ends of the pulse width modulation circuit 120 may be switched through the switching circuit 150.

Figure 4:
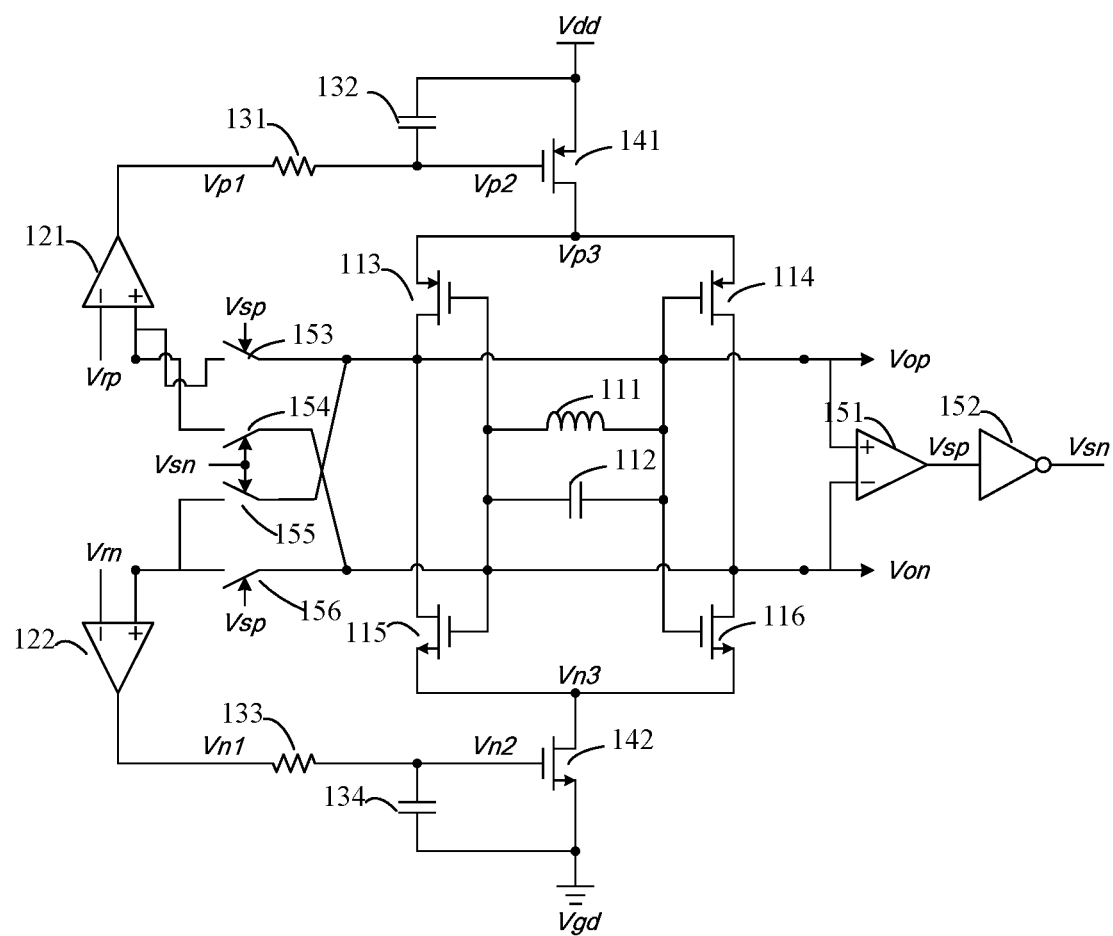
FIG. 4 is a schematic diagram of an amplitude limiting oscillation circuit according to still another embodiment of the present disclosure.

Optionally, as shown in FIG. 4, a switching circuit 150 may include:

a third comparator 151, an inverter 152, a first switch 153, a second switch 154, a third switch 155 and a fourth switch 156.

A positive input end of the third comparator 151 is connected to a positive output end of an oscillation circuit 110, a negative input end of the third comparator 151 is connected to a negative output end of the oscillation circuit 110, an input end of the inverter 152 is connected to an output end of the third comparator 151, an output signal Vsp of the third comparator 151 is used to control the first switch 153 and the fourth switch 156, and an output signal Vsn of the inverter 152 is used to control the second switch 154 and the third switch 155.

In this case, optionally, a pulse width modulation circuit 120 may include:

a first comparator 121, where a positive input end of the first comparator 121 is connected to the positive output end of the oscillation circuit 110 through the first switch 153, and connected to the negative output end of the oscillation circuit 110 through the second switch 154, and a negative input end of the first comparator 121 is configured to input a first reference signal Vrp; and a second comparator 122, where a positive input end of the second comparator 122 is connected to the positive output end of the oscillation circuit 110 through the third switch 155, and connected to the negative output end of the oscillation circuit 110 through the fourth switch 156, and a negative input end of the second comparator 122 is configured to input a second reference signal Vrn.

When Vop is greater than Von, Vsp is a high level, the first switch 153 and the fourth switch 156 are switched on, and the second switch 154 and the third switch 155 are switched off; the first comparator 121 compares Vop with Vrp to outputs Vp1; and the second comparator 122 compares Von with Vrn to outputs Vn1; and Vsp is a low level and Vsn is a high level, the second switch 154 and the third switch 155 are switched on, and the first switch 153 and the fourth switch 156 are switched off; the first comparator 121 compares Von with Vrp to outputs Vp1; and the second comparator 122 compares Vop with Vrn to outputs Vn1.

Therefore, whether Vop is greater than Von, or Vop is less than Von, the first comparator 121 may output Vp1, and the second comparator 122 may output Vn1; that is, ranges of duty cycle of Vp1 and Vn1 may both be changed to 0~100%.

The parts oscillation circuit, the low pass filtering circuit and the voltage controlled resistance circuit in the FIG. 4 are similar to that in FIG. 2; and for concision, they will not be described redundantly herein.

An operating principle of the amplitude limiting oscillation circuit in FIG. 4 is similar to that in FIG. 2, and the difference lies in that the adjustable range is expanded since a switching circuit is used in FIG. 4. Taking the P-type feedback loop as an example, in FIG. 2, a range of duty cycle of Vp1 is 0~50%, a voltage range of Vp2 after filtering is 0~0.5Vdd, and the adjustable range is relatively narrow. However, in FIG. 4, the range of duty cycle of Vp1 is changed to 0~100%, thereby widening the adjustable range.

According to an amplitude limiting oscillation circuit of the embodiments of the present disclosure, negative feedback is performed by using a voltage controlled resistance circuit, and a control loop may not introduce extra noise; therefore, phase noise of the amplitude limiting oscillation circuit is lower.

Further, amplitude control of the amplitude limiting oscillation circuit of the embodiments of the present disclosure is mainly based on source electrode feedback; therefore, the manner of the amplitude control does not have a problem of stability, that is, the stability of the amplitude limiting oscillation circuit of the embodiments of the present disclosure is better.

In addition, when a comparator is used, amplitude of the amplitude limiting oscillation circuit depends on a reference voltage of the comparator, that is, a final amplitude range of the amplitude limiting oscillation circuit is very close to the reference voltage of the comparator; therefore, it is easy to control the oscillation amplitude of the amplitude limiting oscillation circuit of the embodiments of the present disclosure.

Therefore, with the technical solution of the embodiments of the present disclosure, performance of an amplitude limiting oscillation circuit may be improved.

Another embodiment of the present disclosure further provides a chip, and the chip may include the amplitude limiting oscillation circuit of the foregoing embodiments of the present disclosure.

It should be understood that, the specific examples in this text is for helping those skilled in the art to better understand the embodiments of the present disclosure, rather than limiting the scope of the embodiments of the present disclosure.

Those of ordinary skill in the art may realize that, units and algorithm steps in conjunction with the various examples described by the embodiments disclosed herein can be realized by electronic hardware, computer software or the combination thereof, and in order to clearly describe the interchangeability of hardware and software, the compositions and steps of the various examples are generally described according to functions in the foregoing description. Whether these functions are executed in hardware or software mode depends on the specific applications and design constraint conditions of the technical solution. Those skilled may implement the described functions by using different methods for each specific application, but this implementation should not be considered to be beyond the scope of the present disclosure.

In the several embodiments provided in the present application, it should be understood that, the disclosed system, apparatus and method may be implemented in other manners. For example, the apparatus embodiments described above are merely exemplary, e.g., the division of the units is merely a logic function division, other division manners may exist in practical implementation, for example, a plurality of units or components may be combined or integrated to another system, or some features may be omitted or not implemented. In addition, the displayed or discussed mutual coupling or direct coupling or communication connection may be indirect coupling or communication connection via some interfaces, apparatuses or units, and may also be in electrical, mechanical or other forms.

The units described as separate parts may be or may not be separated physically, and a component displayed as a unit may be or may not be a physical unit, namely, may be located in one place, or may be distributed on a plurality of network units. A part of or all of the units may be selected to achieve the purposes of the solution in the embodiments of the present disclosure according to actual demands.

In addition, the respective functional units in the respective embodiments of the present disclosure may be integrated in one processing unit, or the respective units singly exist physically, or two or more units are integrated in one unit. The foregoing integrated unit may be implemented in the form of hardware, or be implemented in a form of a software functional unit.

If the integrated unit is implemented in the form of the software functional unit and is sold or used as an independent product, it may be stored in a computer readable storage medium. Based on such understanding, the technical solution of the present disclosure substantially, or the part of the present disclosure making contribution to the prior art, or all of or part of the technical solution may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present disclosure. The foregoing storage medium includes a variety of media capable of storing program codes, such as a USB disk, a mobile hard disk, a read-only memory (ROM, Read-Only Memory), a random access memory (RAM, Random Access Memory), a magnetic disk, an optical disk or the like.

Described above is the specific embodiments of the present disclosure only, but the protection scope of the present disclosure is not limited to this, any skilled one who is familiar with this art could readily think of various equivalent modifications or substitutions within the disclosed technical scope of the present disclosure, and these modifications or substitutions shall fall within the protection scope of the present disclosure. Therefore, the protection scope of the present disclosure shall be defined by the claims.

What is claimed is:

1. An amplitude limiting oscillation circuit, comprising:
    an oscillation circuit, configured to generate an oscillation signal;
    a pulse width modulation circuit, configured to generate a pulse width modulation signal according to an amplitude of the oscillation signal;
    a low pass filtering circuit, configured to convert the pulse width modulation signal into a direct current control voltage signal; and
    a voltage controlled resistance circuit, configured to change a resistance value of the voltage controlled resistance circuit under control of the direct current control voltage signal, to control the amplitude of the oscillation signal;
    wherein the pulse width modulation circuit comprises a comparator, configured to generate the pulse width modulation signal by comparing an amplitude of a reference signal with the amplitude of the oscillation signal.

2. The amplitude limiting oscillation circuit according to claim 1, wherein the oscillation circuit is an LC oscillation circuit, a crystal oscillation circuit or a relaxation oscillation circuit.

3. The amplitude limiting oscillation circuit according to claim 1, wherein the low pass filtering circuit is a passive filter or an active filter.

4. The amplitude limiting oscillation circuit according to claim 1, wherein resistance of the voltage controlled resistance circuit is linear resistance or nonlinear resistance that operates in a linear region.

5. The amplitude limiting oscillation circuit according to claim 1, wherein the voltage controlled resistance circuit comprises a metal oxide semiconductor field effect transistor.

6. The amplitude limiting oscillation circuit according to claim 1, wherein the oscillation circuit comprises a positive output end and a negative output end.

7. The amplitude limiting oscillation circuit according to claim 6, wherein the oscillation circuit comprises:
    an inductor, and a first capacitor, wherein the inductor and the first capacitor form a resonant circuit; and
    a first MOS transistor, a second MOS transistor, a third MOS transistor, and a fourth MOS transistor, wherein the first MOS transistor, the second MOS transistor, the third MOS transistor, and the fourth MOS transistor provide negative resistance for the resonant circuit, a drain electrode of the first MOS transistor and a gate electrode of the second MOS transistor form a positive output end of the oscillation circuit, and a gate electrode of the third MOS transistor and a drain electrode of the fourth MOS transistor form a negative output end of the oscillation circuit.

8. The amplitude limiting oscillation circuit according to claim 6, wherein the pulse width modulation circuit comprises:
    a first comparator, wherein a positive input end of the first comparator is connected to the positive output end of the oscillation circuit and a negative input end of the first comparator is configured to input a first reference signal; and
    a second comparator, wherein a positive input end of the second comparator is connected to the negative output end of the oscillation circuit, and a negative input end of the second comparator is configured to input a second reference signal.

9. The amplitude limiting oscillation circuit according to claim 8, wherein the low pass filtering circuit comprises:
   a first low pass filter, comprising a first resistor and a second capacitor, wherein an input end of the first low pass filter is connected to an output end of the first comparator, and an output end of the first low pass filter is connected to a gate electrode of a fifth MOS transistor; and
   a second low pass filter, comprising a second resistor and a third capacitor, wherein an input end of the second low pass filter is connected to an output end of the second comparator, and an output end of the second low pass filter is connected to a gate electrode of a sixth MOS transistor; and
   the voltage controlled resistance circuit comprises:
   the fifth MOS transistor, wherein a source electrode of the fifth MOS transistor is connected to a power supply, and a drain electrode of the fifth MOS transistor is connected to a source electrode of the first MOS transistor and a source electrode of the second MOS transistor; and
   the sixth MOS transistor, wherein a source electrode of the sixth MOS transistor is connected to ground, and a drain electrode of the sixth MOS transistor is connected to a source electrode of the third MOS transistor and a source electrode of the fourth MOS transistor.

10. The amplitude limiting oscillation circuit according to claim 6, wherein the amplitude limiting oscillation circuit further comprises:
   a switching circuit, configured to switch a connection between the positive input end or the negative output end and the pulse width modulation circuit.

11. The amplitude limiting oscillation circuit according to claim 10, wherein the switching circuit comprises:
   a third comparator, an inverter, a first switch, a second switch, a third switch and a fourth switch;
   wherein a positive input end of the third comparator is connected to the positive output end of the oscillation circuit, a negative input end of the third comparator is connected to the negative output end of the oscillation circuit, an input end of the inverter is connected to an output end of the third comparator, an output signal of the third comparator is used to control the first switch and the fourth switch, and an output signal of the inverter is used to control the second switch and the third switch.

12. The amplitude limiting oscillation circuit according to claim 11, wherein the pulse width modulation circuit comprises:
   a first comparator, wherein a positive input end of the first comparator is connected to the positive output end of the oscillation circuit through the first switch, and connected to the negative output end of the oscillation circuit through the second switch, and a negative input end of the first comparator is configured to input a first reference signal; and
   a second comparator, wherein a positive input end of the second comparator is connected to the positive output end of the oscillation circuit through the third switch, and connected to the negative output end of the oscillation circuit through the fourth switch, and a negative input end of the second comparator is configured to input a second reference signal.

13. The amplitude limiting oscillation circuit according to claim 12, wherein the low pass filtering circuit comprises:
   a first low pass filter, comprising a first resistor and a second capacitor, wherein an input end of the first low pass filter is connected to an output end of the first comparator, and an output end of the first low pass filter is connected to a gate electrode of a fifth MOS transistor; and
   a second low pass filter, comprising a second resistor and a third capacitor, wherein an input end of the second low pass filter is connected to an output end of the second comparator, and an output end of the second low pass filter is connected to a gate electrode of a sixth MOS transistor; and
   the voltage controlled resistance circuit comprises:
   the fifth MOS transistor, wherein a source electrode of the fifth MOS transistor is connected to a power supply, and a drain electrode of the fifth MOS transistor is connected to a source electrode of the first MOS transistor and a source electrode of the second MOS transistor; and
   the sixth MOS transistor, wherein a source electrode of the sixth MOS transistor is connected to ground, and a drain electrode of the sixth MOS transistor is connected to a source electrode of the third MOS transistor and a source electrode of the fourth MOS transistor.

* * * * *